(12) United States Patent
Hsu et al.

(10) Patent No.: US 9,730,351 B2
(45) Date of Patent: Aug. 8, 2017

(54) ELECTRICAL CONNECTOR ASSEMBLY WITH HOLDING MEMBER

(71) Applicant: FOXCONN INTERCONNECT TECHNOLOGY LIMITED, Grand Cayman (KY)

(72) Inventors: Shuo-Hsiu Hsu, New Taipei (TW); Hao-Yun Ma, San Jose, CA (US)

(73) Assignee: FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 0 days.

(21) Appl. No.: 15/156,353

(22) Filed: May 17, 2016

(65) Prior Publication Data
US 2016/0261070 A1 Sep. 8, 2016

Related U.S. Application Data

(63) Continuation-in-part of application No. 15/069,976, filed on Mar. 15, 2016, which is a continuation-in-part of application No. 14/320,892, filed on Jul. 1, 2014, now Pat. No. 9,337,573.

(51) Int. Cl.
*H01R 13/62* (2006.01)
*H05K 7/10* (2006.01)

(52) U.S. Cl.
CPC .................. *H05K 7/1092* (2013.01)

(58) Field of Classification Search
CPC .............. H01R 12/7076; H01R 12/716; H01R 12/62966; H01R 12/6273; H01R 12/62955; H01R 12/62; H05K 7/1092; H05K 7/12

USPC .......... 361/704, 732, 752; 439/73, 331, 341, 439/342, 352, 313, 334, 343, 351, 361, 439/529, 131, 135, 1, 38, 152, 155, 157, 439/159, 160, 266, 630, 68
See application file for complete search history.

(56) References Cited

U.S. PATENT DOCUMENTS

| | | | | |
|---|---|---|---|---|
| 4,502,747 A * | 3/1985 | Bright | .................. | H05K 7/1069 439/296 |
| 4,531,795 A * | 7/1985 | Sinclair | ................ | H01R 13/633 439/152 |
| 5,332,330 A * | 7/1994 | Kaneko | ................ | H01R 13/629 403/321 |
| 5,448,449 A * | 9/1995 | Bright | ................. | H01L 23/4093 174/16.3 |
| 5,906,497 A * | 5/1999 | Pham | ...................... | G06F 1/184 361/679.46 |

(Continued)

*Primary Examiner* — James Harvey
*Assistant Examiner* — Milagros Jeancharles
(74) *Attorney, Agent, or Firm* — Wei Te Chung; Ming Chieh Chang

(57) ABSTRACT

An electrical connector assembly, adapted for electrically connecting an IC package or module to a printed circuit board, includes a metallic bracket surrounding a stationary electrical connector which is mounted upon the printed circuit board. A module equipped with another electrical connector is positioned upon and removably assembled to the stationary electrical connector. A locking/ejecting member is pivotally mounted upon the bracket to releasably lock the module in position. A retention lever is pivotally mounted upon the bracket to prevent the locking/ejecting member from inadvertently or mistakenly unlatching the locking member from the module.

20 Claims, 16 Drawing Sheets

(56) References Cited

U.S. PATENT DOCUMENTS

| | | | | |
|---|---|---|---|---|
| 6,216,195 B1* | 4/2001 | Lee | ............ | G06F 1/1632 |
| | | | | 361/679.41 |
| 6,510,051 B2* | 1/2003 | Kim | ............ | G06F 1/1632 |
| | | | | 312/223.2 |
| 6,758,691 B1* | 7/2004 | McHugh | ............ | H05K 7/1007 |
| | | | | 439/331 |
| 7,517,229 B2* | 4/2009 | Ma | ............ | H05K 7/1061 |
| | | | | 439/331 |
| 7,817,414 B2* | 10/2010 | Chou | ............ | G06F 1/1632 |
| | | | | 361/679.41 |
| 7,997,919 B2* | 8/2011 | Morinari | ............ | G01R 1/0483 |
| | | | | 439/331 |
| 8,562,367 B2* | 10/2013 | Yokoyama | ............ | G01R 1/0466 |
| | | | | 439/331 |
| 8,597,057 B2* | 12/2013 | Yu | ............ | H01R 13/635 |
| | | | | 439/159 |
| 2015/0349441 A1 | 12/2015 | Hon Hai | | |

* cited by examiner

ELECTRICAL CONNECTOR ASSEMBLY WITH HOLDING MEMBER

The instant application is a CIP (Continuation-in-Part) application of the copending application Ser. No. 15/069,976 filed Mar. 15, 2016 which is a CIP application of U.S. Pat. No. 9,377,573 issued on May 19, 2016.

BACKGROUND OF THE INVENTION

1. Field of the Invention

The present invention relates to an electrical connector assembly, more particularly to an electrical connector assembly adapted for electrically connecting an IC package or module to a printed circuit board.

2. Description of Related Art

Current electrical connector assembly as disclosed in the parent application Ser. No. 15/069,976 discloses the locking member pivotally mounted upon the metallic frame to releasably lock the heat sink. Anyhow, it lacks the retention means thereof to prevent unlock mistakenly and inadvertently.

An improved electrical connector assembly is desired to efficiently retain the locking member in position without a risk of wrong unlatching.

BRIEF SUMMARY OF THE INVENTION

According to one aspect of the present invention, an electrical connector assembly, adapted for electrically connecting an IC package or module to a printed circuit board, includes a metallic bracket surrounding a stationary electrical connector which is mounted upon the printed circuit board. A module equipped with another electrical connector is positioned upon and removably assembled to the stationary electrical connector. A locking/ejecting member is pivotally mounted upon the bracket to releasably lock the module in position. A retention lever is pivotally mounted upon the bracket to prevent the locking/ejecting member from inadvertently or mistakenly unlatching the locking member from the module.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE PREFERRED EMBODIMENTS

Figure 1:
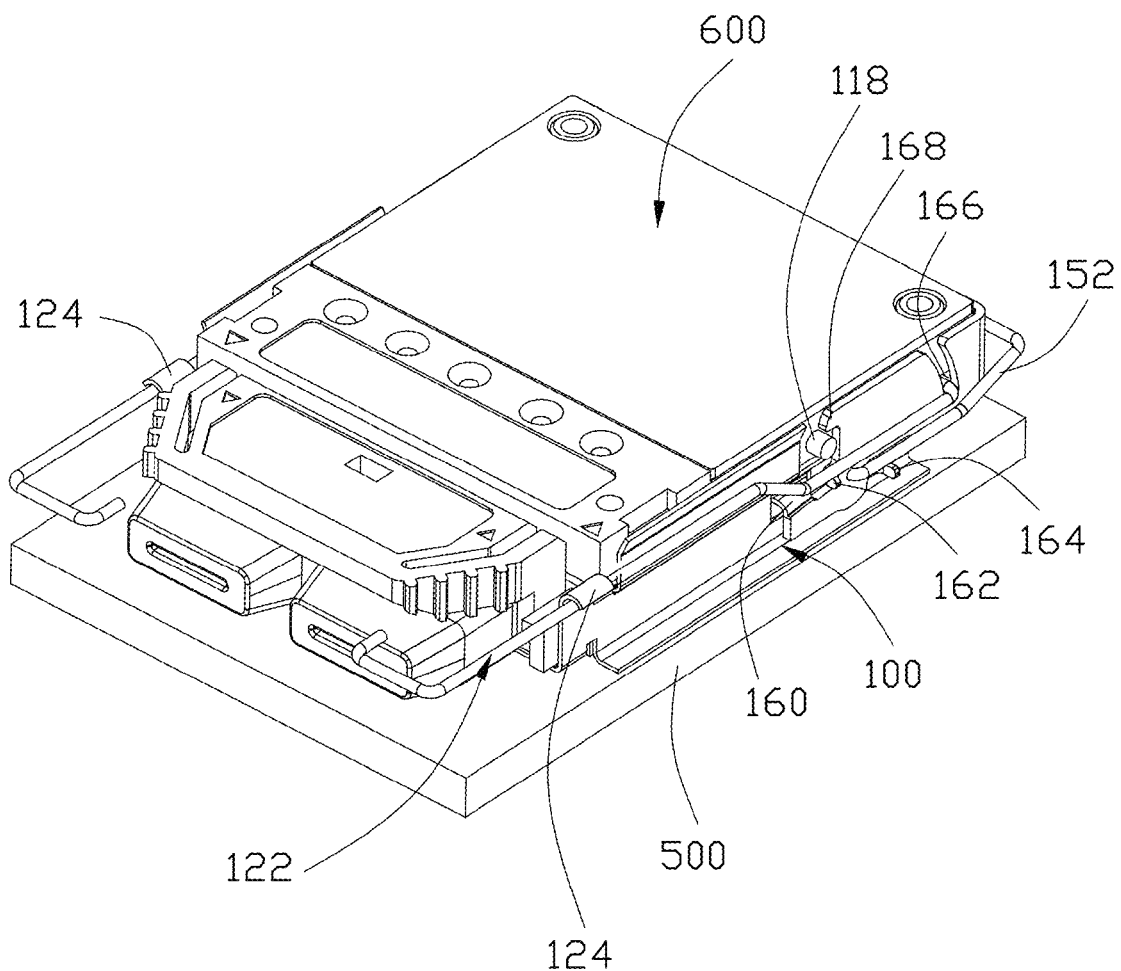
FIG. 1 is a perspective view of the electrical connector assembly in accordance with present invention wherein the module is loaded upon the electrically connector and locked by the locking member.
Figure 2:
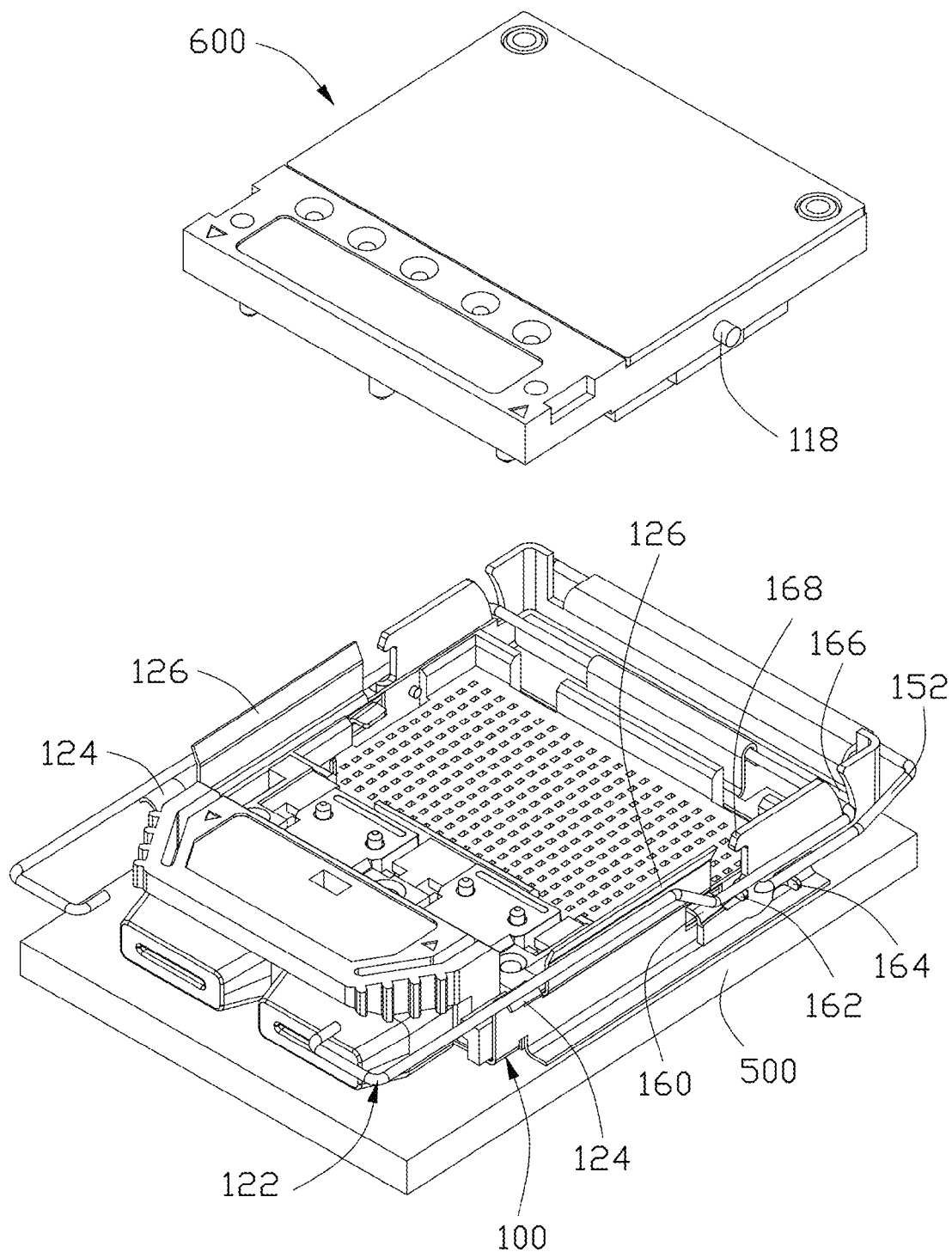
FIG. 2 is an exploded perspective of the electrical connector assembly shown in FIG. 1 wherein the module is moved away from the stationary connector.
Figure 3:
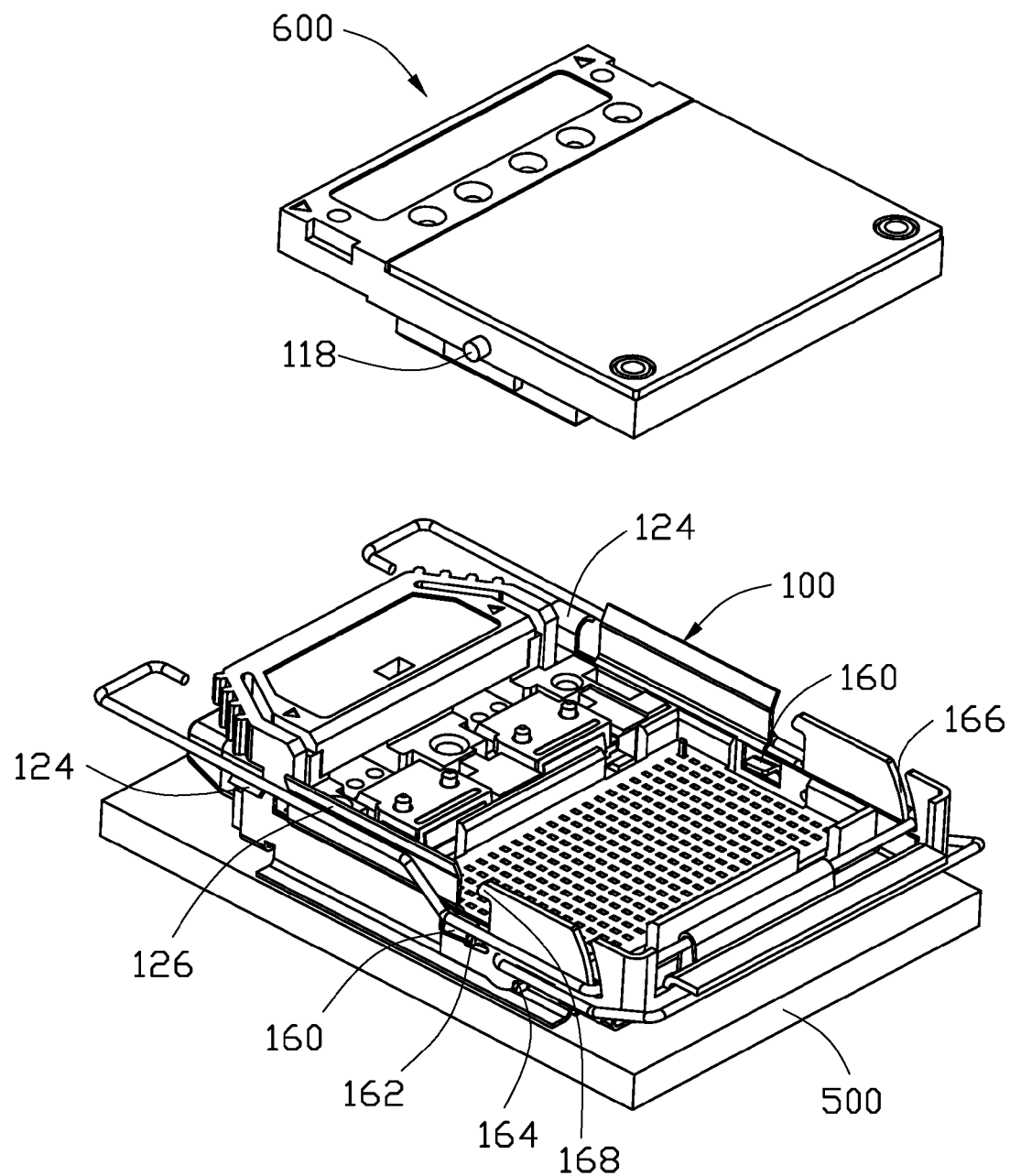
FIG. 3 is another explored perspective view of the electrical connector assembly shown in FIG. 2.
Figure 4:
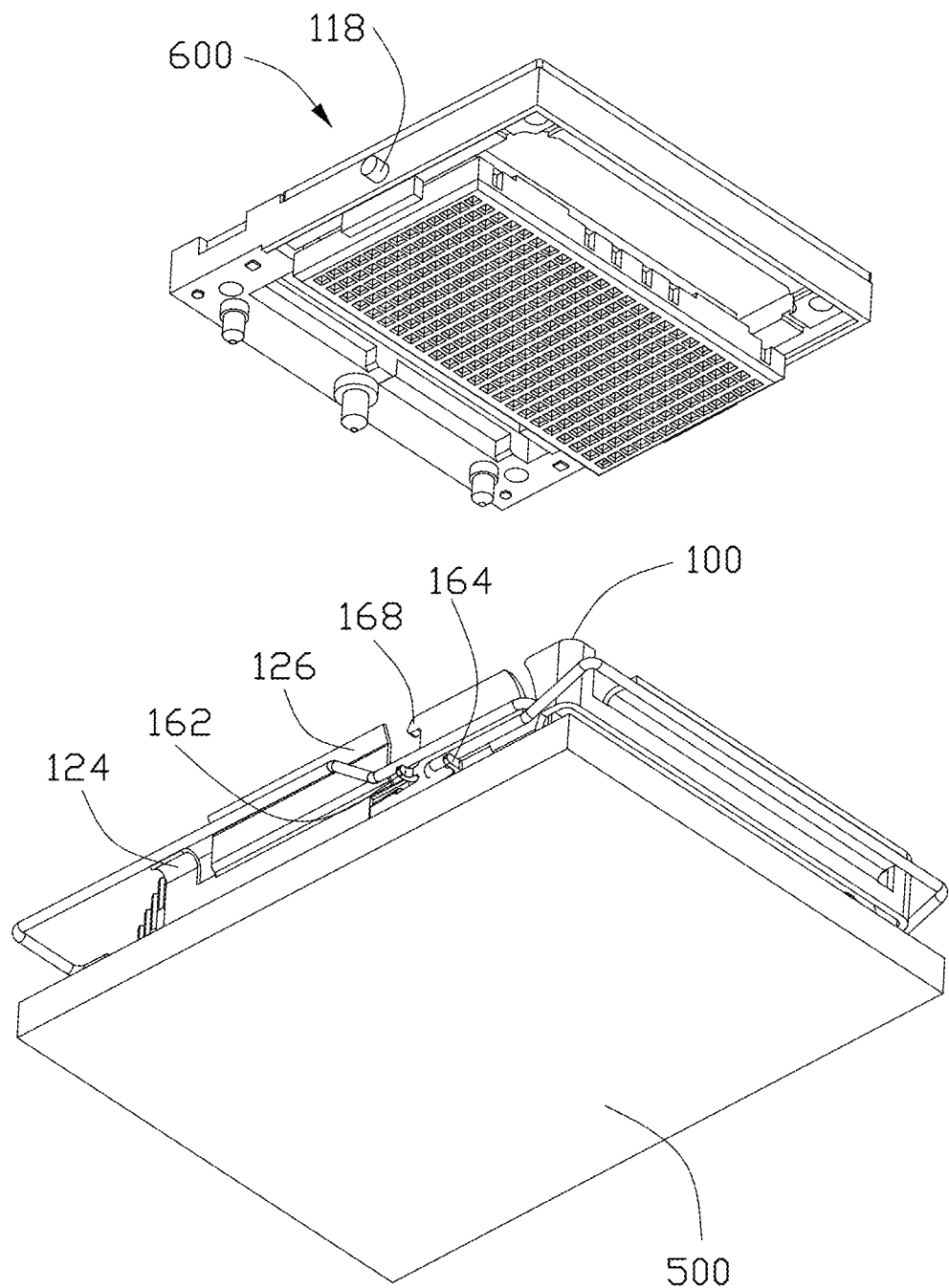
FIG. 4 is another explored perspective view of the electrical connector assembly shown in FIG. 2.
Figure 5:
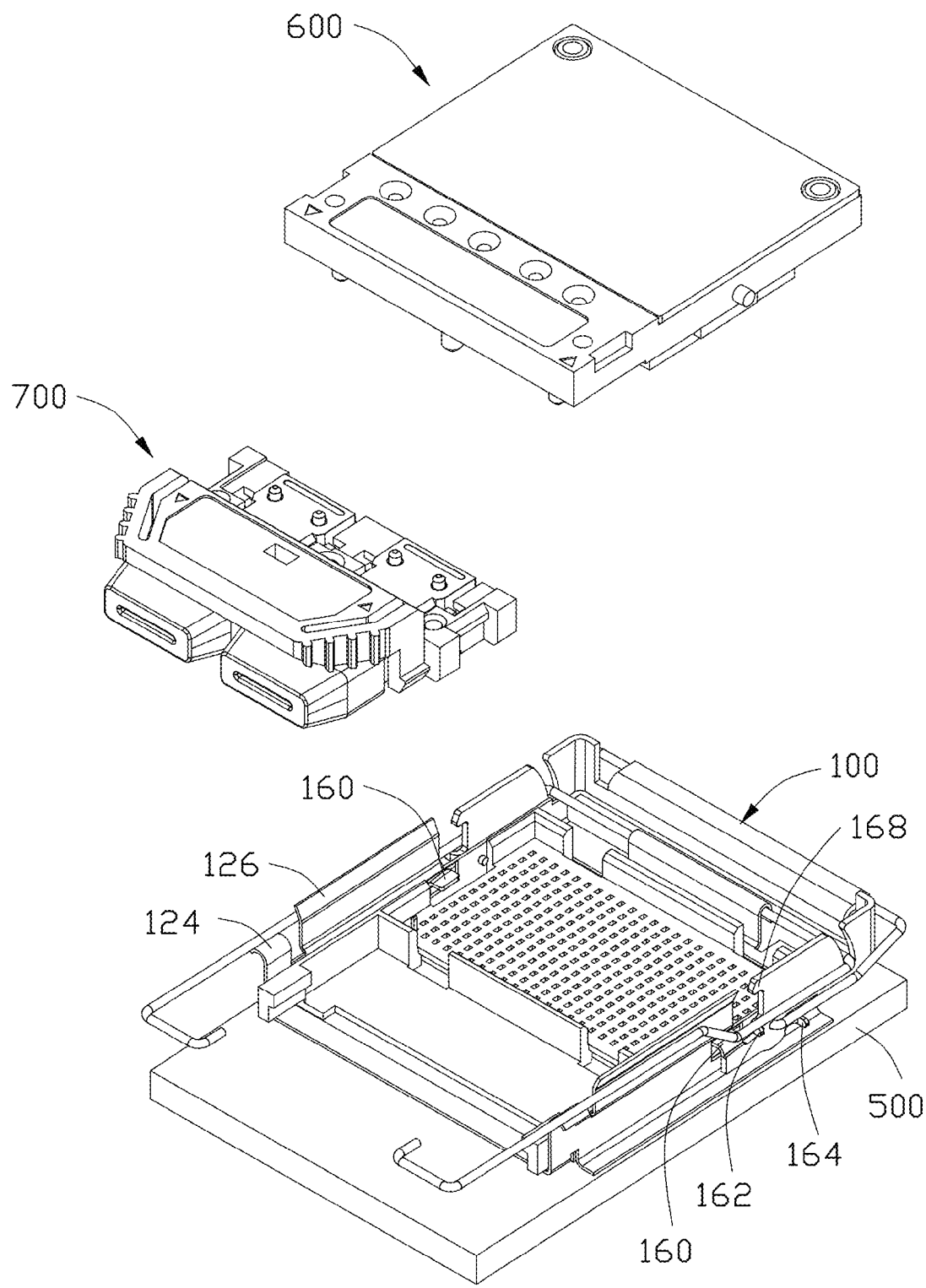
FIG. 5 is a further exploded perspective view of the electrical connector assembly of FIG. 2.
Figure 6:
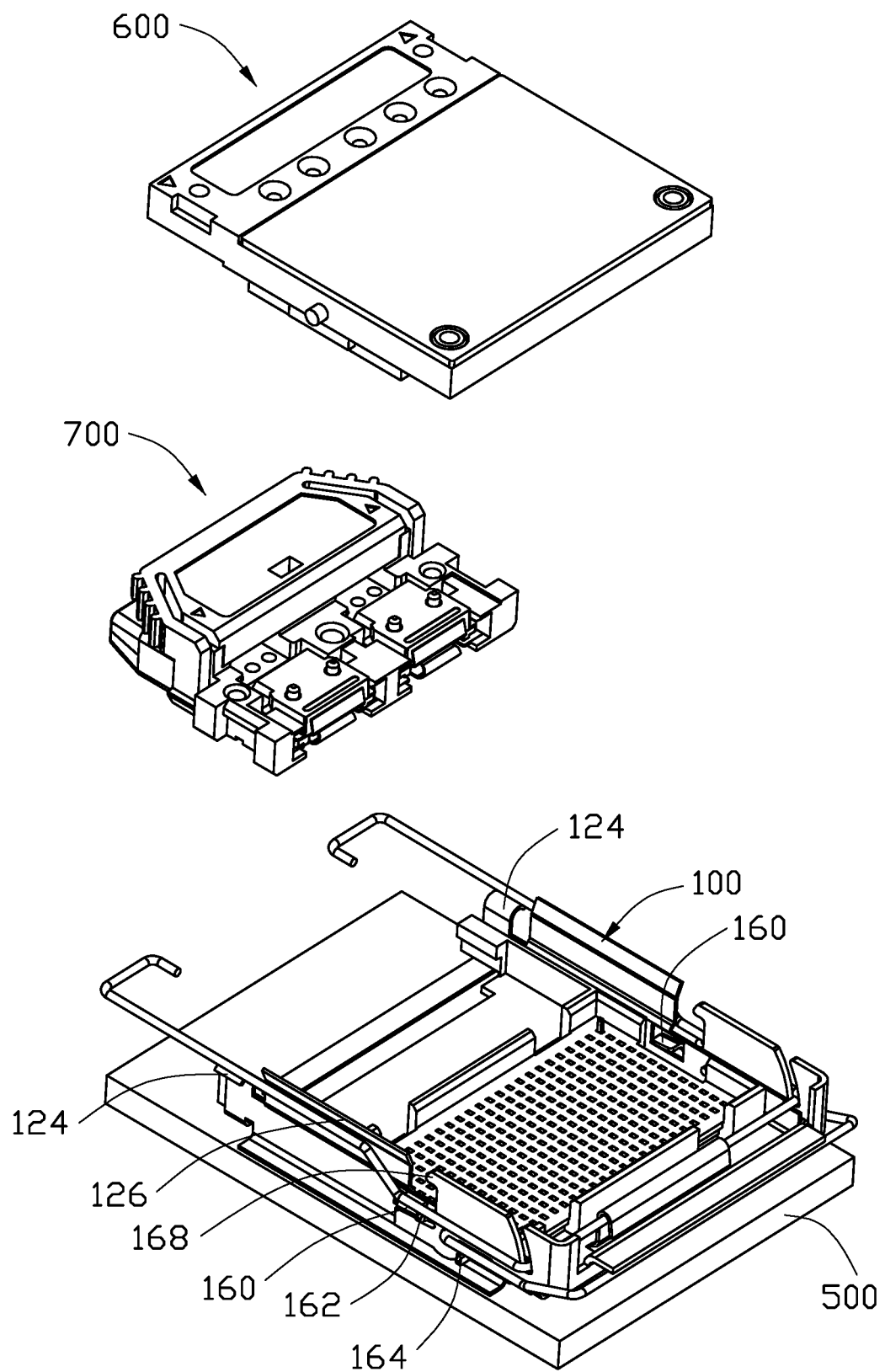
FIG. 6 is another further perspective view of the electrical connector assembly of FIG. 5.
Figure 7A:
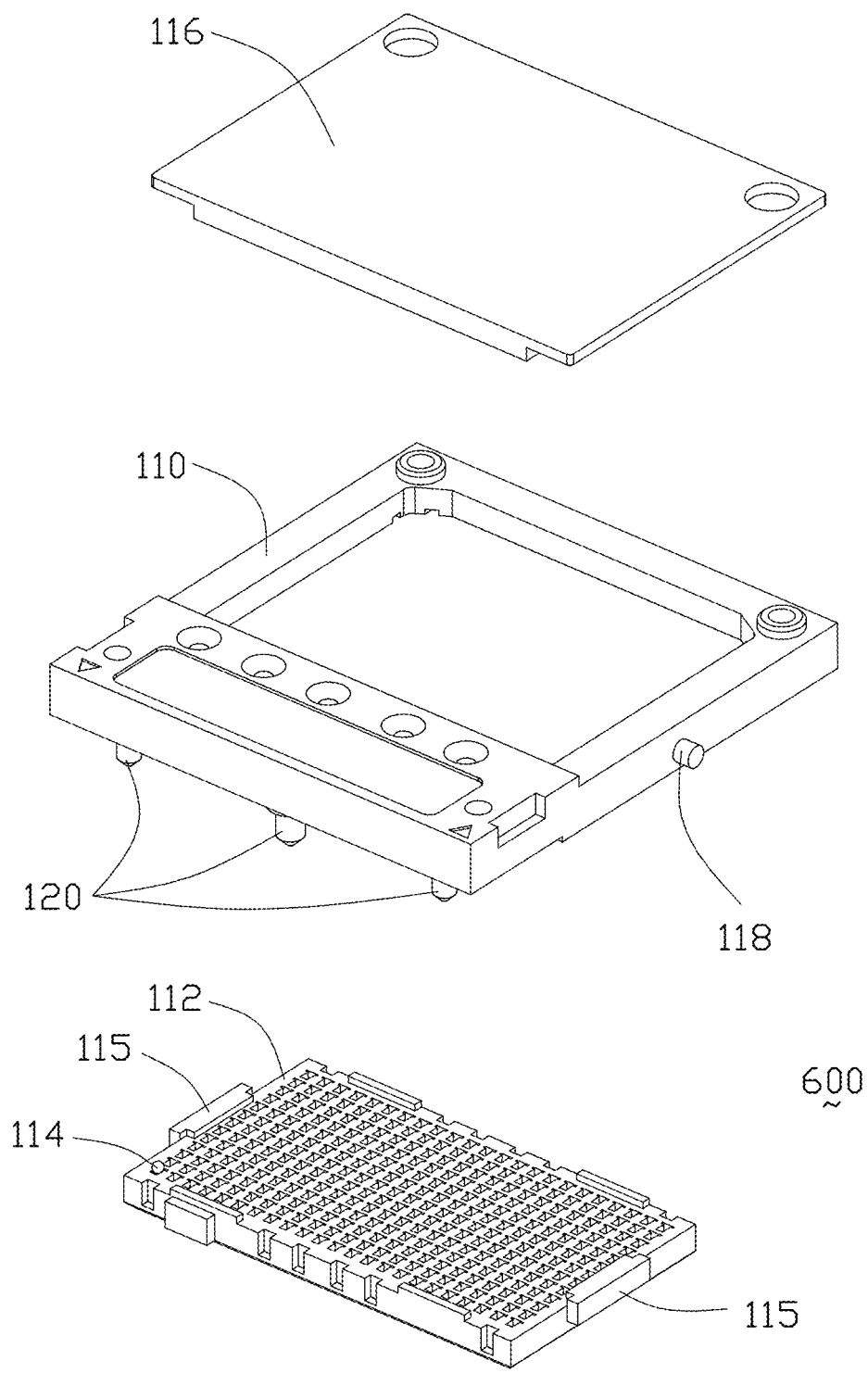
FIG. 7(A) is an exploded perspective view of the module of FIG. 1
Figure 7B:
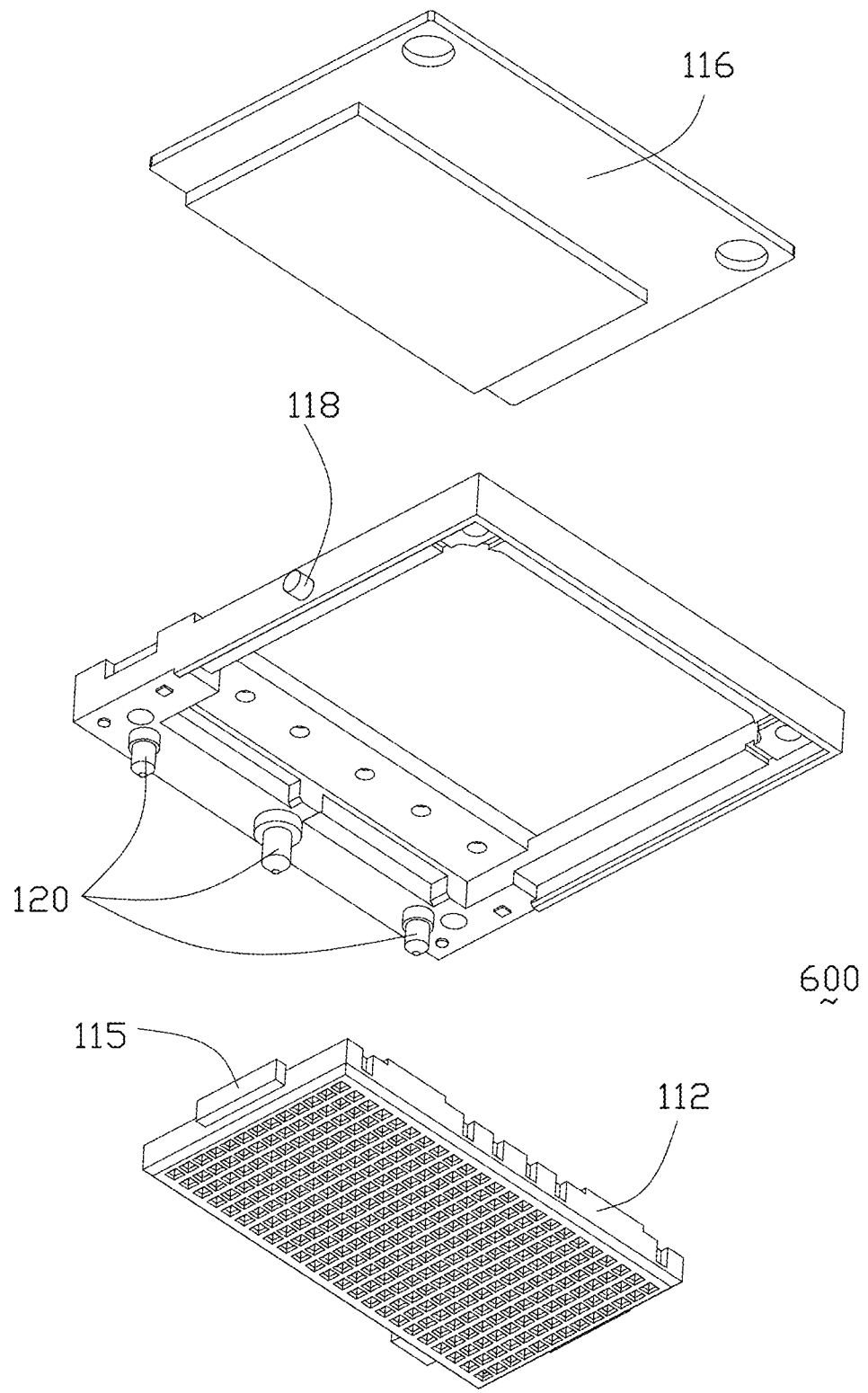
FIG. 7(B) is another exploded perspective view of the module of FIG. 7(A).
Figure 8:
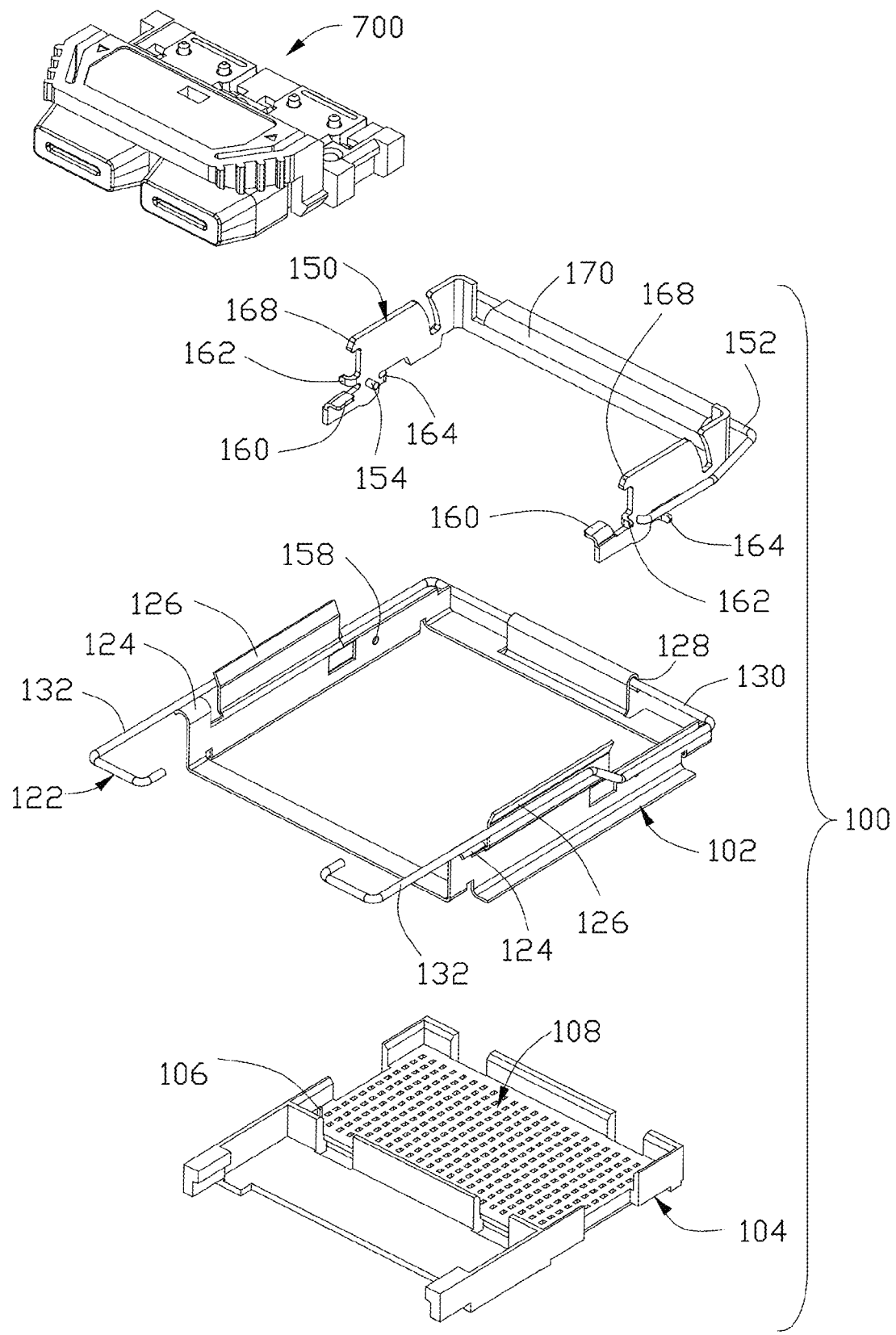
FIG. 8 is a further exploded perspective view of the electrical connector assembly of FIG. 5.
Figure 9:
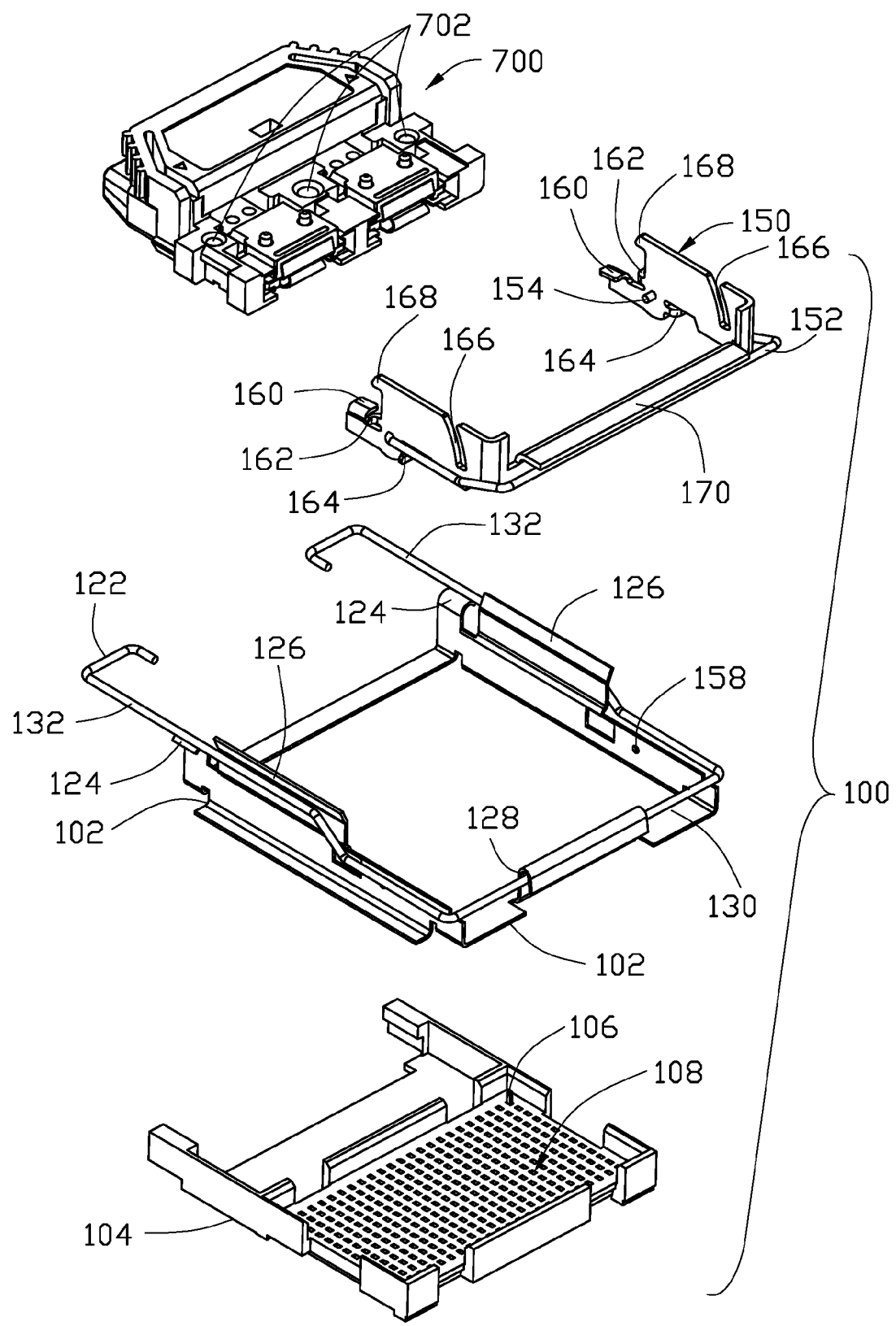
FIG. 9 is another further exploded perspective view of the electrical connector assembly of FIG. 8.
Figure 10:
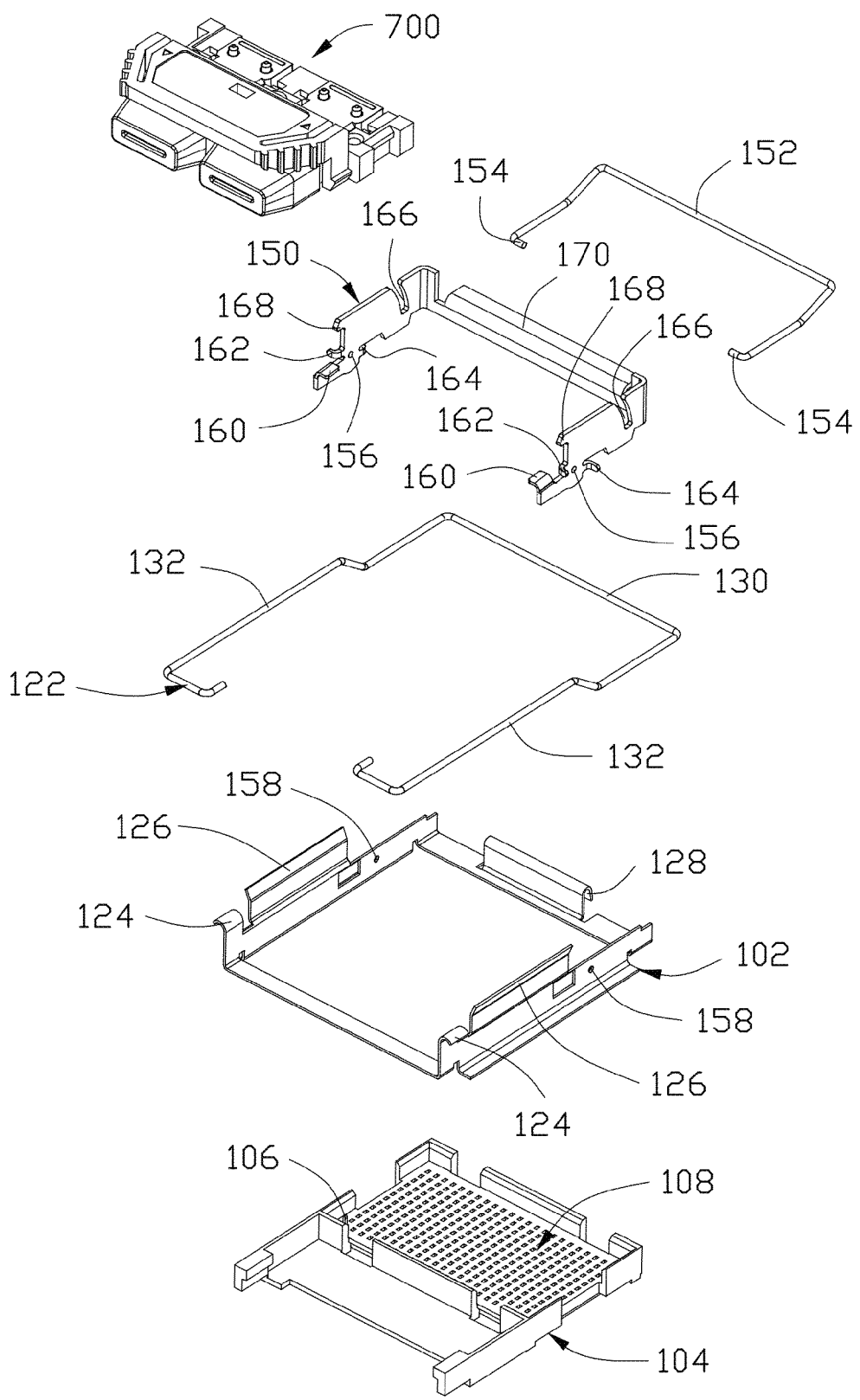
FIG. 10 is a further exploded perspective view of the electrical connector assembly of FIG. 8.
Figure 11:
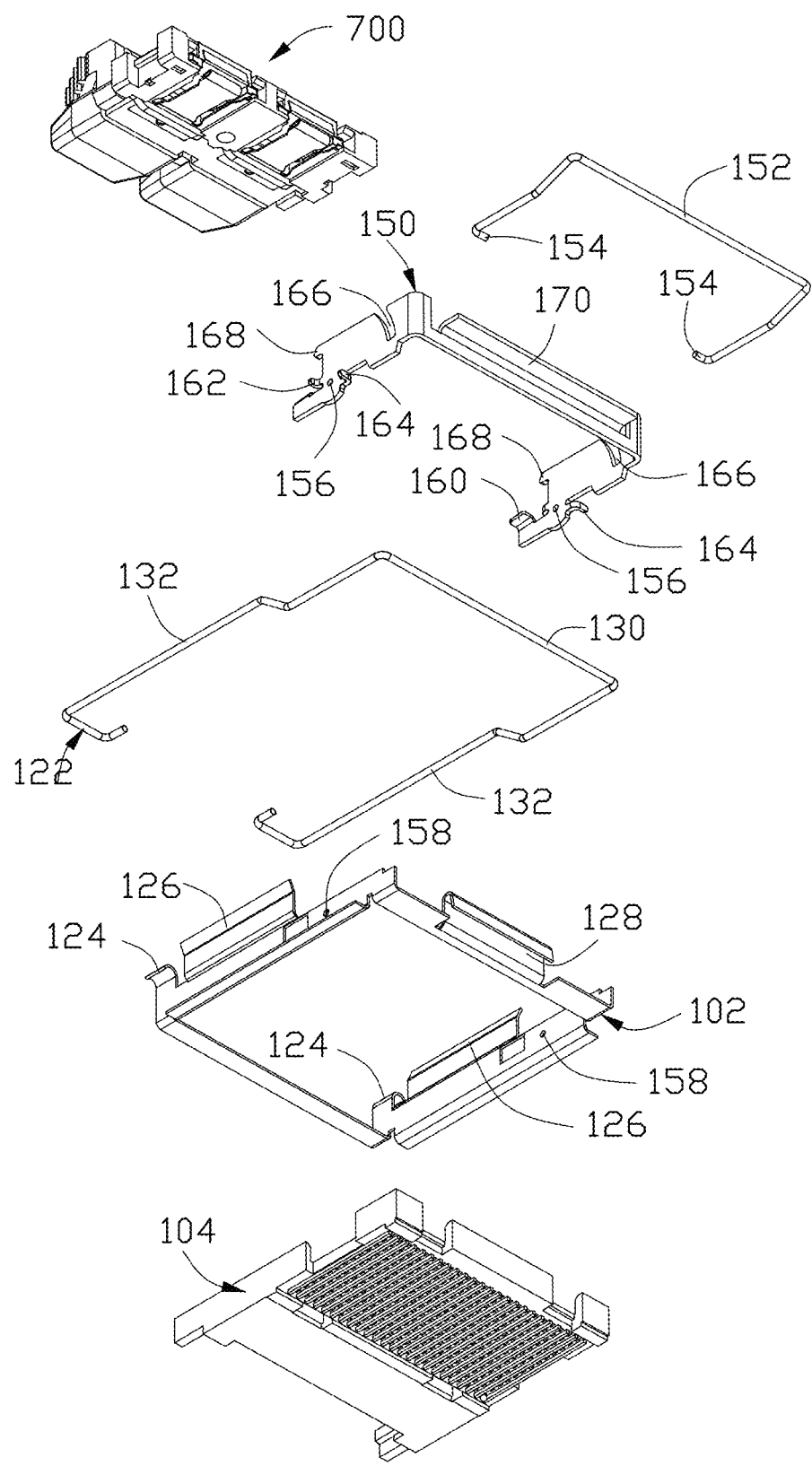
FIG. 11 is another further exploded perspective view of the electrical connector assembly of FIG. 10.
Figure 12:
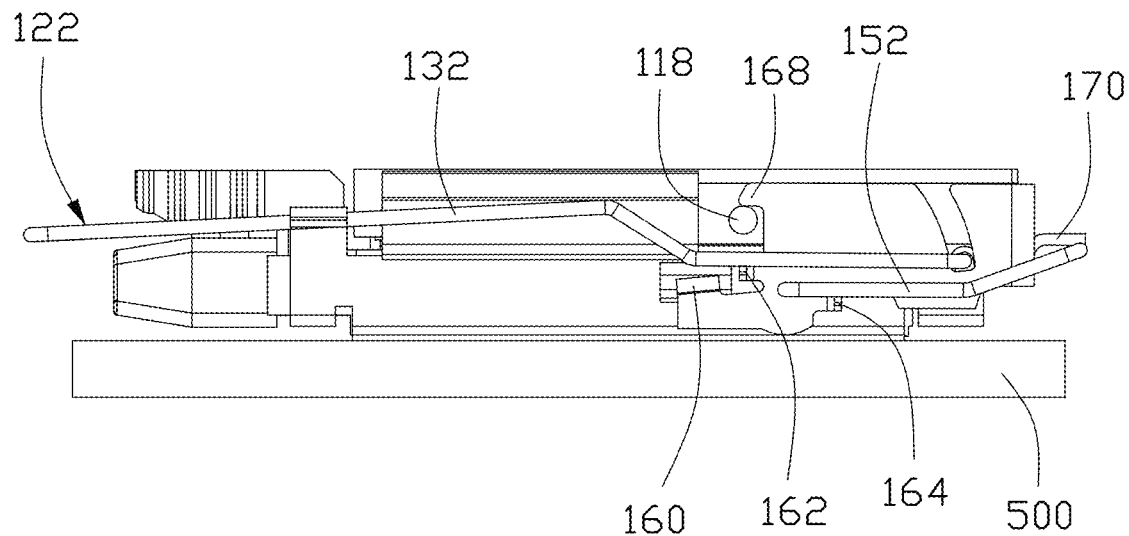
FIG. 12 is a side view of the electrical connector assembly of FIG. 1 to show the module is locked by the locking/ejecting member and the locking/ejecting member is retained by the retention lever when the locking/ejecting member is positioned in a locking position.
Figure 13:
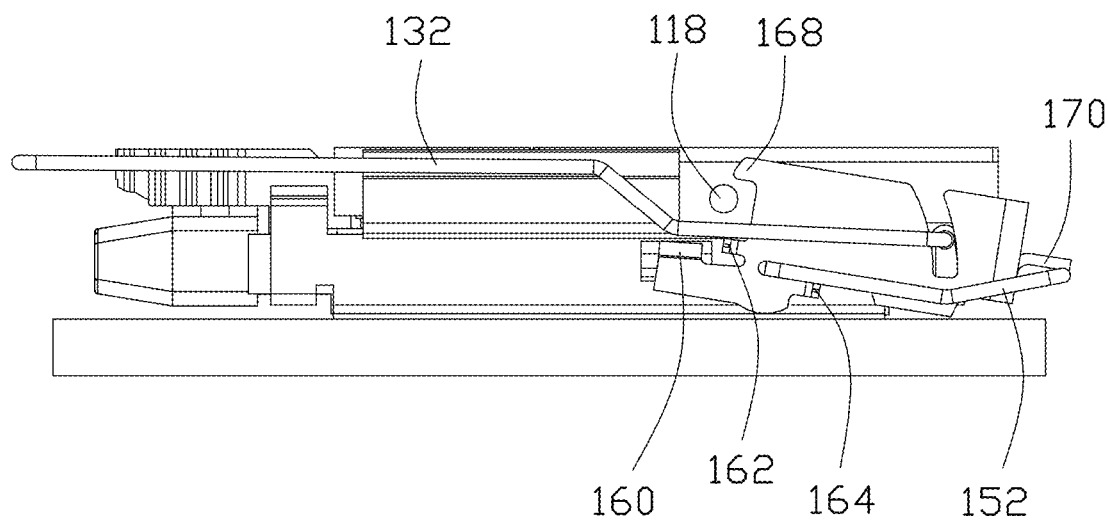
FIG. 13 is a side view of the electrical connector assembly of FIG. 1 to show the module is unlocked from the locking/ejecting member and the locking/ejecting member is no longer retained by the retention lever when the locking/ejecting member is positioned in an unlocking/ejecting position.
Figure 14:
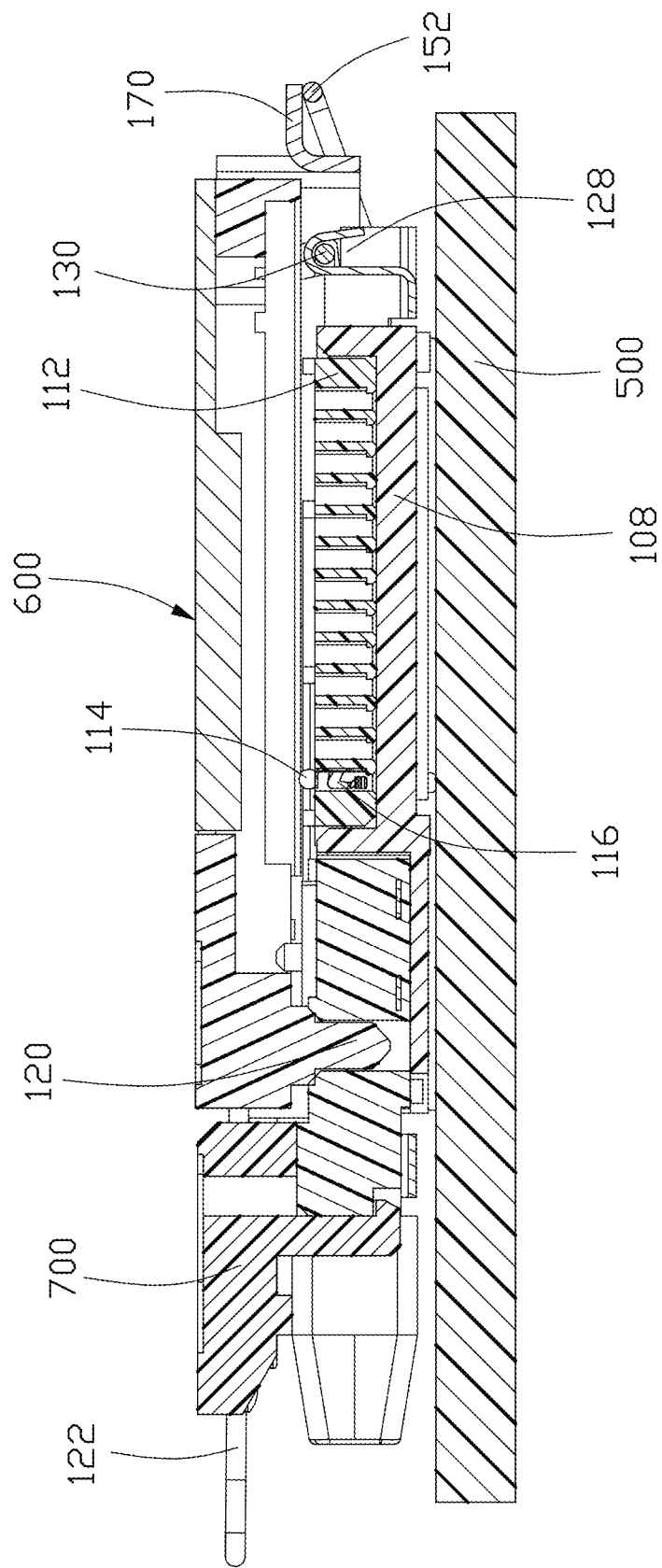
FIG. 14 is a cross-sectional view of the electrical connector assembly of FIG. 1.

In the following description, numerous specific details are set forth to provide a thorough understanding of the present invention. However, it will be obvious to those skilled in the art that the present invention may be practiced without such specific details. In other instances, well-known circuits have been shown in block diagram form in order not to obscure the present invention in unnecessary detail. For the most part, details concerning timing considerations and the like have been omitted inasmuch as such details are not necessary to obtain a complete understanding of the present invention and are within the skills of persons of ordinary skill in the relevant art.

The electrical connector assembly 100 as show in FIG. 1 to FIG. 14, is used for electrically connecting a movable module 600 and a optical jumper member 700 to a printed circuit board 500. The electrical connector assembly 100 includes a metallic bracket/frame 102 surrounding an insulative housing 104 therein. A rear region of the housing 104 is equipped with contacts 106 to form a stationary connector 108. A front region of the housing 104 receives the optical jumper element 700. Similar to what is disclosed in the parent application, the jumper element 700 is adapted to be downwardly assembled into the front region of the housing 104 in the vertical direction and forwardly withdrawn therefrom along the front-to-back direction after disengagement from the module 600.

The module 600 includes a frame 110 to receive an electronic component (not shown), an electrical connector 112 is connected to the electrical connector via the solder balls 114 each of which is linked to a contact 116 (FIG. 14) for mating with the contact 106 of the connector 108. A cover 116 is attached upon the frame 110 to shield the aforementioned electronic component (not shown). The frame includes a pair of transversely extending posts 118 for locking with the locking/ejecting member (illustrated later), and three downwardly extending posts 120 received within the corresponding holes 702 in the jumper element 700. The connector 112 forms a pair of lateral protrusions 115 for use with the locking/ejecting member (illustrated later).

The bracket 102 is equipped with a retention lever 122 and a locking/ejecting member 150 thereof. The bracket 102 soldered upon the printed circuit board 500, includes a pair of locking tabs 124, a pair of lead-in tabs 126 for guiding downward loading of the module 600 into the housing 104, and a pivot groove 128. The retention lever 122 forms a pivotal shaft 130 received within the pivot groove 128, and a pair of operation arms 132 each adapted to be moved between an upper rest position between the locking tab 124 and the lead-in tab 126, and a lower securing position under the locking tab 124. The locking/ejecting member 150 forms a U-shaped structure with an ejecting lever 152 which is used to provide the pivotal axes 154 of the locking/ejecting member 150 so as to allow the locking/ejecting member 150 to be pivotally mounted upon the bracket 102 via the pivotal axes 154 extending through the pivotal holes 156 in the locking/ejecting member 150 and the pivotal holes 158 in the bracket 102. The locking/ejecting member 150 further includes a pair of ejecting tabs 160 to upward eject the lateral protrusion 115 when the locking/ejecting member 150 is unlocked to be downwardly rotated, a pair of restricting tabs 162 to be downwardly pressed by the corresponding operation arms 132 when the retention lever 122 is positioned in the lower locking position where the arms 132 are locked under the locking tabs 124, and a pair of abutment tabs 164 which are used to retain the ejecting lever 152 in position with regard to the locking/ejecting member 150. A pair of slots 166 are formed in the locking/ejecting member 150 to receive the pivotal shaft 130 therein so as to allow the downwardly pivotal movement of the locking/ejecting member 150 with regard to the pivotal shaft 130. A pair of locking heads 168 respective downwardly press the corresponding extending posts 118 in position when the locking/ejecting member 150 is in a locked position.

When the retention lever 122 is locked by the locking tab 124, the restricting tab 162 is downwardly pressed by the arm 132 so as to preclude rotation of the locking/ejecting member 150 when the downward force is applied upon the ejecting lever 152 which downwardly presses the abutment tab 164 for rotation tendency. Anyhow, when the retention lever 122 is released from the locking tab 124 and retained at the rest position between the locking tab 124 and the lead-in tab 126, the restricting tab 162 is no longer downwardly pressed by the arm 132 so as to allow rotation of the locking/ejecting member 150 when the downward force is applied upon the ejecting lever 152 which downwardly presses the abutment tab for rotation tendency. Once rotated, the locking head 168 no longer locks the corresponding extending post 118, and the ejecting tab 160 upwardly urges the corresponding lateral protrusion 115 of the connector 112 to push the electrical connector 112 away from the stationary connector 108 so as to allow upward removal of the whole module 600. Notably, in this embodiment, the ejecting lever 152 is downwardly pressed via the flange 170 of the locking/ejecting member 150 wherein the ejecting lever 152 is essentially retained to the locking/ejecting member 150 via the three points retention, i.e., abutment of the ejecting lever 152 with the flange 170 and with the abutment tab 164, and the pivotal axis 154 received within the pivotal hole 158.

Compared with the parent application, unless intentionally releasing the retention lever 122 from the locking tab 124, the additional retention lever 122 assures reliable locking between locking/ejecting member 150 with regard to the module 600 without any inadvertent or mistaken ejection thereof advantageously. On the other hand, the module is retained advantageously in a preloaded manner via the locking head 168 and the extending post 118 because the retention lever 122 is in a tensioned manner to force the module 600 downwardly due to downward abutment of the arm 132 against the retention tab 162.

Figure 15:
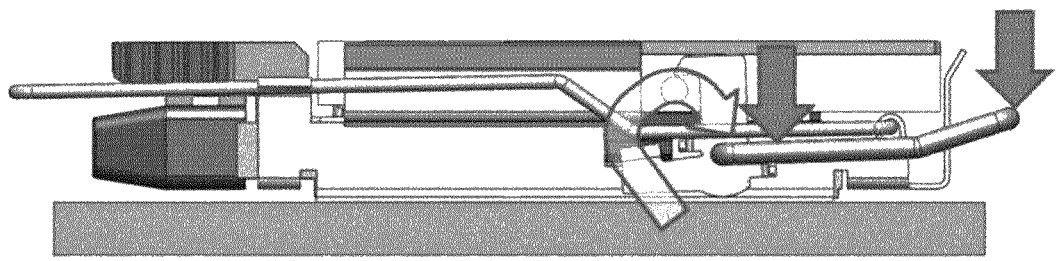
FIG. 15 is a side view of an electrical connector assembly according to another embodiment with a simplified/shortened locking/ejecting member thereof to show the module is locked by the locking/ejecting member and the locking/ejecting member is retained by the retention lever.
Figure 16:
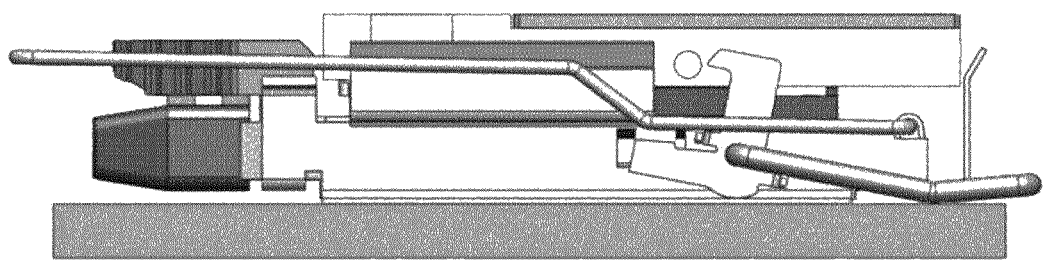
FIG. 16 is a side view of the electrical connector assembly of FIG. 15 to show the module is unlocked from the locking/ejecting member and the locking/ejecting member is no longer retained by the retention lever.
Figure 17:
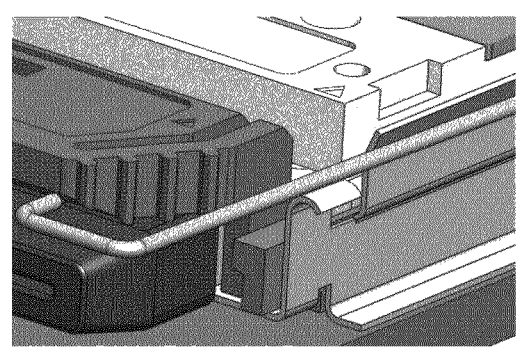
FIG. 17 is an enlarged partial perspective view of the electrical connector assembly of FIG. 15 to show the retention lever is not located in a locking position but retained in an lifted position not to hinder the pivotal movement of the locking/ejecting member.

FIGS. 15-17 show another embodiment similar to the first embodiment while the locking/ejecting member is shortened without the flange to abut against the ejecting lever so as to have the ejecting lever abut against the locking/ejecting member at two points instead of three points. Anyhow, the operation effect is still the same with the first embodiment, i.e., the retention lever assuring no inadvertent unlatching of the locking/ejecting member due to improper impact upon the locking/ejecting member It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

We claim:

1. An electrical connector assembly for use with an electrical module, comprising:
a metallic bracket for mounting upon a printed circuit board, being equipped with a moveable retention lever and a locking/ejecting member which is pivotally mounted thereon between a locking position and an unlocking/ejecting position;
an insulative housing enclosed within the bracket and cooperating with a plurality of contacts to form a stationary connector;
an electrical module downwardly assembled into the housing in a vertical direction and including another connector mated with the stationary connector; wherein
the locking/ejecting member is engaged with the retention lever in a position where the locking/ejecting member is located at the locking position to lock the module in position with regard to the housing and the locking/ejecting member is released from the retention lever so as to allow the locking/ejecting member to be moved toward the unlocking position to eject upwardly the module out of the housing.

2. The electrical connector assembly as claimed in claim 1, wherein the locking/ejecting member forms an ejecting tab to eject the module from the housing, and a restricting tab to be downwardly pressed by the retention lever.

3. The electrical connector assembly as claimed in claim 2, wherein said ejecting tab upwardly presses a lateral protrusion formed on said another connector.

4. The electrical connector assembly as claimed in claim 1, wherein the bracket forms a locking tab to retain the retention lever in position with regard to the bracket, and the locking/ejecting member forms a locking head to secure the module in position with regard to the bracket.

5. The electrical connector assembly as claimed in claim 4, wherein the retention lever is moveable between a locked position, where the retention lever is locked by the locking tab, and a rest position where the retention lever is released from the locking tab.

6. The electrical connector assembly as claimed in claim 4, wherein the module includes an extending post to be locked by the locking head.

7. The electrical connector assembly as claimed in claim 4, wherein said rest position is between the locking tab and a lead-in tab on the bracket, and said lead-in tab is upwardly tapered to guide the module to be downwardly loaded into the housing.

8. The electrical connector assembly as claimed in claim 1, wherein the locking/ejecting member forms a slot to allow the retention lever to extend therethrough in a transverse direction perpendicular to said vertical direction, and to move along the slot.

9. The electrical connector assembly as claimed in claim 8, wherein said slot is curved.

10. The electrical connector assembly as claimed in claim 1, wherein said locking/ejecting member is equipped with an ejecting lever having a pivotal axis extending through a pivotal hole in the bracket so as to perform pivotal movement of locking/ejecting member with regard to the bracket.

11. The electrical connector assembly as claimed in claim 1, wherein a jumper element is positioned in the housing in front of the connector, and the module is further secured to the jumper element in the vertical direction.

12. A method of loading/unloading a module into/from an electrical connector assembly, comprising steps of:
providing said electrical connector assembly with a metallic bracket enclosing an insulative housing, said housing being equipped with contacts to form a stationary connector;
providing a retention lever moveable upon the bracket, said retention lever moveable between a locking position and a rest position;
providing an locking/ejecting member pivotally mounted upon the bracket, said locking/ejecting member forming an ejecting tab for ejecting the module, a locking head for locking the module, and a restricting tab pressed by the retention lever; wherein
when the locking/ejecting member locks the module in position, the retention lever locks the locking/ejecting member to prevent mistaken pivotal movement of the locking/ejecting member; the locking/ejecting member is rotated to unlock the module and further eject the module out of the housing only after the retention lever releases the locking/ejecting member.

13. The method as claimed in claim 12, wherein the bracket includes a locking tab to lock the retention lever.

14. The method as claimed in claim 13, wherein the bracket is provided with a lead-in tab to guide downward loading of the module, and the retention lever is located at a rest position between the locking tab and the lead-in tab when the retention lever releases the locking/ejecting member.

15. The method as claimed in claim 12, wherein the housing defines opposite front and rear ends, an operation area of the locking/ejecting member is located around the rear end while an operation area of the retention lever is located around the front end.

16. The method as claimed in claim 12, further including a step of loading a jumper element into a space of the housing in front of the stationary connector, and when the module is downwardly loaded into the housing the module is assembled to the jumper element.

17. An electrical connector assembly comprising:
a printed circuit board;
a metallic bracket mounted upon the printed circuit board;
an insulative housing mounted upon the printed circuit board and enclosed in the bracket, the housing defining a rear region equipped with a plurality of contacts to form a stationary connector, a front region equipped with a jumper element which is configured to be downwardly assembled and forwardly withdrawn with regard to the housing;
a locking/ejecting member pivotally mounted upon the bracket and forming a locking head for locking the module, an ejecting tab for upwardly ejecting the module;
a retention lever moveably mounted upon the bracket; wherein
the locking/ejecting member is secured by the retention lever when the locking head locks the module; the locking/ejecting member is able to be rotated to unlock the module only after the retention lever releases the locking/ejecting member.

18. The electrical connector assembly as claimed in claim 17, wherein said locking/ejecting member further includes a restricting tab against which the retention lever downwardly presses.

19. The electrical connector assembly as claimed in claim 17, wherein said locking/ejecting member is further equipped with an ejecting lever with an operation area around a rear end of the housing.

20. The electrical connector assembly as claimed in claim 17, wherein an operation area of the retention lever is located around a front end of the housing.

* * * * *